March 4, 1969 KIKUO DOUTA ET AL 3,430,334

METHOD OF MANUFACTURING INTEGRATED CIRCUITS

Filed March 31, 1966

INVENTORS
KIKUO DOUTA
HARUO MATUMARU
TAKEO NISHIMURA

BY Paul M. Craig, Jr.
ATTORNEY

United States Patent Office 3,430,334
Patented Mar. 4, 1969

3,430,334
METHOD OF MANUFACTURING INTEGRATED CIRCUITS

Kikuo Douta, Hachioji-shi, and Haruo Matumaru and Takeo Nishimura, Tokyo, Japan, assignors to Hitachi, Ltd., Tokyo, Japan, a corporation of Japan Filed Mar. 31, 1966, Ser. No. 539,124
Claims priority, application Japan, Apr. 1, 1965, 40/18,634
U.S. Cl. 29—577 2 Claims
Int. Cl. H01l 1/16, 7/00, 1/24

ABSTRACT OF THE DISCLOSURE

When an electrically resistive material deposited on a silicon oxide layer laid on a semiconductor body is subjected to an etching process to be formed into resistors, the silicon oxide and the semiconductor body also are subject to being etched. The silicon oxide and the semiconductor body are protected from the etching process by applying an anticorrosive resin on the silicon oxide preliminarily to the deposition of the electrically resistive material in a reverse pattern of the pattern of the resistors to be formed by the etching.

Figure 1:
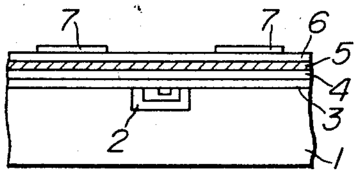

The present invention relates to a method of manufacturing integrated circuits, and more specifically, to a method of manufacturing so-called hybrid integrated circuits by forming a passive circuit element such as a resistor or a capacitor on one face of a semiconductor substrate wherein an active element such as a transistor or a diode has been formed.

A hybrid integrated circuit is featured in that an integrated circuit is formed by providing an active circuit element or elements within a semiconductor substrate and a passive circuit element or elements on said semiconductor substrate, utilizing said semiconductor as the substrate for a thin film circuit and further by electrically connecting said active circuit element or elements with said passive circuit element or elements.

Among other devices of this kind, there is one known as the semiconductor integrated circuit wherein an integrated circuit is formed by providing an active circuit element and a passive circuit element all within a semiconductor body so as to be connected with each other within said body or by providing such elements in the semiconductor body and connecting them with a conductor formed thereon by evaporation technique. Also, there is known a thin film integrated circuit comprising a passive element or elements and an active element or elements formed by means of evaporation technique or like method on one insulator substrate.

Of the foregoing three types of integrated circuits, the hybrid integrated circuit is superior to the other two for the following reasons. First, in the semiconductor integrated circuit a passive element such as a resistor or capacitor, and an active element such as a transistor or diode are formed in a single semiconductor substrate, but this type of circuit has a drawback that the respective elements are not prefectly isolated from each other. Isolation of elements has been effected, in general, by the provision of a p-n junction. However, since the leakage current of the p-n junction is considerable, and in the case of a high frequency current applied to this circuit, the capacity of this p-n junction will be of such a magnitude as cannot be neglected. Furthermore, where a resistor or a capacitor is formed in a single semiconductor substrate, the degree of precision in values of resistance and capacitance is inherently low because of the small space for manufacture. As to the thin film integrated circuit, the greatest defect noted of this type of integrated circuit is that no stable and precise active circuit element can be achieved at present. The active circuit elements, which are commonly used at present, consist of field effect transistors or diodes formed by depositing CdS. Transistors or diodes of the types other than the field effect type are difficult to make. Where it is desired to use such transistors or diodes of the types other than the field effect type, it has been the practice to prepare an ordinary type transistor or diode separately and then put the same in position in the thin film circuit. In a device of this type, however, the transistor or diode used is generally larger in size and occupies an undesirably greater portion of the space. On the other hand, however, the thin film integrated circuit with the aforesaid structure has an advantage that a passive circuit such as the resistor or capacitor can be manufactured with high accuracy and with no appreciable difficulty.

After all consideration, it is desirous that the active circuit elements be formed within a semiconductor body and that the passive circuit elements be formed by the evaporation technique or some technique. The device which satisfied these requirements is the hybrid integrated circuit.

Figure 3:
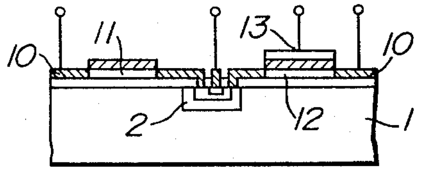
Figure 2:
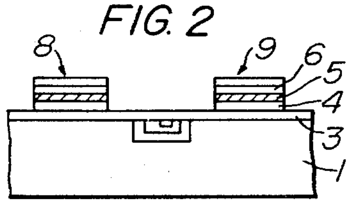
Figure 4:
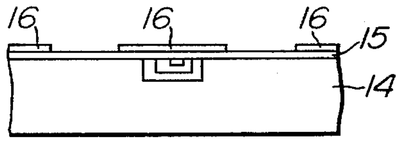
Figure 5:
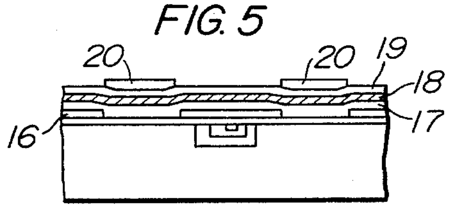
Figure 6:
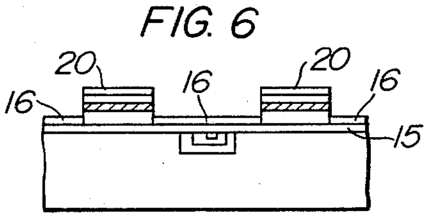

The present invention will be more clearly understood by reading the following description in connection with the accompanying drawings which are provided by way of example only, wherein:

FIGS. 1 through 3 illustrate the conventional process of manufacturing hybrid integrated circuits, wherein FIG. 3 represents the completed hybrid integrated circuit assembly; and FIGS. 4 through 6 represent the hybrid integrated circuit manufacturing process of the present invention.

In general, a hybrid integrated circuit has been manufactured by the process as shown in FIGS. 1 through 3. It is to be understood that the essential parts of the device in these drawings are provided in an enlarged scale for the convenience of explanation. An active element 2 (transistor or diode) is formed in advance on one surface of a semiconductor substrate 1, and said surface of the semiconductor substrate is coated with a $SiO_2$ film 3. An electrical resistive material, for example, tantalum 4 is deposited on said surface by evaporation technique. The resultant surface is then anodized and the sheet resistivity of the coating of tantalum is controlled by oxidizing the tantalum coating up to a desired depth. Numeral 5 in the drawings represents a layer of tantalum oxide. Said electrically resistive material is not restricted to only such materials as would permit anodic oxidation, but includes ordinary electrically resistive materials such as a nickel chrome alloy which may be deposited on the $SiO_2$ film by such techniques as vacuum evaporation or sputtering, and thereafter coated with an insulating material by such techniques as evaporation, pyrolysis or sputtering. Next, an electrode material 6 such as aluminum is deposited on the layer of tantalum oxide by evaporation. A light-sensitive anti-corrosive resin, for example, KPR, a product of Kodak Corporation, is applied to the layer of aluminum. The resultant light-sensitive film is exposed to light through an appropriate mask, and the portions of the film not exposed to light are removed. In the drawings, numeral 7 indicates the portions of KPR which have been exposed to light. Subsequently, the deposited metal layer and the metal oxide layer are partially etched off with a strong acid or strong alkaline solution. In general, a caustic potash (KOH) is often used for the etching of the layer of tantalum oxide, while a liquid mixture of fluoric acid (HF) and nitric acid ($HNO_3$) is often used for the etching of the layer of metal. FIG. 2 shows the layers formed as desired by etching. It will be noted that the layers have been completely removed except the layer of $SiO_2$ and also the layer of the metal and the layer of metal oxide beneath the KPR coating 7. This is a technique called photo-etching which is often used in the field of semiconductor industry.

Now, if circuit elements are to be formed with these remaining portions 8 and 9 in such manner that the portion 8 serves as a resistor element and the portion 9 as a capacitor element the next procedure to be taken is to remove only the layers of deposited aluminum and resin in said passive circuit element 8 and exposing, by a photo-etching technique similarly as the preceding procedure an electrode portion of the active circuit element (transistor or diode) is formed in the semiconductor body. It is to be also understood that the resin coating on the top of the passive circuit element 9 is also removed. Then, an electrode material with a high electric conductivity which is indicated by numeral 10 in FIG. 3 is evaporation-deposited on the resulting surface in accordance with a predetermined pattern to electrically connect the passive circuit element formed on the semiconductor substrate with the active circuit element formed in the semiconductor body whereby a complete predetermined electric circuit is formed. Numeral 11 represents a formed resistor while numeral 13 represents a formed capacitor.

The foregoing is the typical conventional process of manufacturing a hybrid integrated circuit. A plurality of passive circuit elements may be formed on the semiconductor substrate as required. Similarly, the active circuit element is not necessarily limited to only one transistor and/or diode but a plurality of transistors or diodes may also be provided. Any way, a desired number of passive circuit elements and active circuit elements are formed in accordance with the desired circuit design.

One of the problems which has been encountered in the hybrid integrated circuit manufacturing process is the danger that the substrate portion which, in the foregoing example, includes the $SiO_2$ film and the Si substrate, is also susceptible to being etched while etching is performed according to the predetermined pattern. Unnecessary portions of the tantalum and those of the tantalum oxide layer are removed therefrom by the etching technique, using an etching liquid comprising a strong acidic liquid or strong alkaline liquid such as NaOH for etching tantalum oxides, and $HF\text{-}HNO_3$ for etching tantalum. As the etching is effected by the use of such strong etchants, an over-etching will result in an etched substrate, while insufficient etching will result in an incomplete removal of the unnecessary portions of the metal layer. For these reasons, efforts of accomplishing successful etching have included precise calculation of the duration of etching process, the etching temperature and the composition of the etching solutions. However, there is a limitation to such efforts as will be understood by those skilled in the art, and such limitation, in turn, results in a fairly low yield of products. In the case where there is over-etching or insufficient etching, it is impossible to produce a hybrid integrated circuit. Where there is insufficient etching, for instance, it is difficult to visually determine whether or not the unnecessary portions of the metal layer have been successfully removed. In the case where such portions have not been completely removed, it may be found in the following manufacturing steps that the passive elements themselves are short-circuited with each other. Where there is over-etching, on the other hand, the $SiO_2$ film may be affected, and there may be cases where the $SiO_2$ film (of the order of $1\mu$) is perforated resulting in the exposure of the semiconductor substrate. A damage in $SiO_2$ film will enhance the probability of the active circuit element being destroyed. In order to better control this complicated and difficult etching treatment, there has been employed a procedure for slowing the velocity of etching by adding some suitable liquid for example, pure water, in the etching liquid, but no satisfactory result has been obtained as yet.

It is, therefore, an object of the present invention to provide a method of manufacturing hybrid integrated circuits having high performance.

Another object of the present invention is to provide a method of manufacturing hybrid integrated circuits in high yield.

Still another object of the present invention is to provide a method of manufacturing hybrid integrated circuits having uniform characteristics and suited for mass production.

The principle of the present invention with which the foregoing objects of the present invention are attained is described below.

One of the greatest difficulties involved in the manufacture of hybrid integrated circuits, namely, the defect that where passive elements are formed by an etching process the etching is often extended to the substrate itself, is eliminated by the employment of the following procedure. The surface of the substrate (silicon oxide film) which is to be exposed to the etching liquid is first coated, with an anti-corrosive material. Thereafter, the materials with which passive circuit elements are formed are deposited in layers on the substrate by means of, for example, evaporation, and subsequently a passive circuit element or elements formed thereon by etching the layers into a predetermined shape. As a result, even if the etching should happen to last beyond the required duration of time, the surface of the semiconductor would not be etched because of the fact that the surface of the substrate is coated with an anti-corrosive material such as anti-corrosive resin. After the etching has been performed sufficiently, the layer of anti-corrosive resin is removed, and a high-quality passive circuit element is formed.

Now, a preferred embodiment of the present invention will be described in connection with FIGS. 4 through 6. It is to be understood that this is an embodiment where the process of the present invention is applied to the typical conventional method of manufacturing a hybrid integrated circuit. In the drawings, the essential portions of the device are provided in an enlarged scale for the convenience of explanation. It is also to be understood that while, in general practice, several hundred hybrid integrated circuits are formed in a single semiconductor wafer, the description herein made concerns the manufacture of one such circuit for the sake of convenience.

In FIGS. 4 through 6 of the drawings, numeral 14 represents a semiconductor substrate wherein an active circuit element such as a transistor is formed by the known impurities-selective-diffusion technique. The surface of the semiconductor substrate is provided with a $SiO_2$ film 15. This $SiO_2$ film may be formed on the surface of the semiconductor substrate after the active element is formed, or may be formed on the surface of the semiconductor substrate in the process of forming the active circuit element. A light-sensitive anti-corrosive resin 16 such as KPR, a product of Kodak, is applied on said $SiO_2$ film and predetermined portions of the resin coating is exposed to light through a predetermined mask. Thereafter, the unsensitized portions of KPR coating are removed from the $SiO_2$ film 15. The resulting structure is shown in FIG. 4, wherein individual portions of the layer of KPR are seen to have been formed on the $SiO_2$ film 15. The selectively deposited individual portions of the layer constitute a feature of the present invention and they play the role of preventing the surface portions of the substrate beneath these portions of the layer of KPR from being exposed to the etching liquid. Thereafter, by the known technique of evaporation, the entire surface of the substrate including the formed portions of the layer of KPR is coated with a tantalum layer 17 which material is of an electrically resistive material. Subsequently, the resulting surface of the tantalum layer is anodized to convert its surface into an oxide of tantalum so as to serve as an insulator and dielectric material, while controlling the sheet resistivity of the tantalum layer so as to conform to the passive circuit element constant. In the drawings, numeral 18 represents the layer of the oxide of tantalum. As the next step, aluminum layer 19 is deposited on the oxide layer 18 by evaporation. Thereafter, a layer 20 of a predetermined anti-corrosive resin is formed on said aluminum layer 19. The pattern of the layer of resin is inversive to the pattern of the previously sensitized resin layer 16. The pattern of the second layer of resin is made in just the same way as in the case of the pattern for the layer 16. After the second resin layer of the predetermined pattern has been formed, the aluminum layer and the layers of tantalum and tantalum oxide are etched. The resulting state of the circuit after etching is shown in FIG. 6. While the metal layers on the anti-corrosive resin 16 are completely removed by the process of etching, the $SiO_2$ film is prevented from being etched by virtue of the resin layer 16. After the etching has been completed, the resin layers 16 and 20 are removed. Subsequently, a hybrid integrated circuit as is shown in FIG. 3 is formed by a known process. The shape, the size and the material of the hybrid integrated circuit may vary depending upon the specifications of the required circuit. A typical example of a hybrid integrated circuit produced according to the method of the present invention comprised a semiconductor substrate having a thickness of from $100\mu$ to $200\mu$, a $SiO_2$ film of $1\mu$ in thickness, a layer of KPR having a thickness ranging from $0.3\mu$ to $1\mu$, and a layer of tantalum 1300 A. thick in which the upper 300 A. was anodized. In this case, the sheet resistance was approximately $50\Omega$.

A hybrid integrated circuit is thus completed by the foregoing process. The method of the present invention may be equally applicable to various circuits to conform with the design of such circuits. For example, the method of the present invention may be applied to a circuit wherein some of the passive circuit elements are formed in the semiconductor substrate or where some of the active circuit elements are formed on the semiconductor substrate as in the case of a thin film circuit.

As has been discussed above, according to the present invention, an anti-corrosive film with a pattern inversive to the desired pattern of circuit is formed previously on a substrate, and this film serves in such manner as if the surface of the substrate has been directly given an anti-corrosive treatment. Therefore, even when a strong etching liquid is used or where the substrate is made of a material which is easily affected by such etching liquid, the substrate is always free from being affected in any way by the etching process and thus it has become possible to enhance the speed of the etching treatment.

In the embodiment, anodizable tantalum was used as the electrically resistant material. Such material is not necessarily restricted to tantalum alone, but other electrically resistant materials may also be used. Anodizable materials bear the advantages that the oxidation of the materials is easily controlled, that the resistance value is controlled with high accuracy and that it is easy to make capacitors. Anodizable materials include aluminum, titanium, zirconium, niobium and wolfram, in addition to tantalum.

As has been described, the process of the present invention now has completely obviated the danger of a substrate being affected by the etching treatment during the process of forming passive circuit elements, resulting in an enhancement of the speed of etching. The present invention, having thus solved a serious difficulty which is encountered in the formation of circuits, standardizes the characteristics of the circuit elements, facilitates mass production of precision circuits, displays effectiveness particularly in the improvement of the electrical characteristics of the circuit elements such as the high frequency characteristics, and furthermore greatly facilitates the formation of hybrid integrated circuits, thereby enhancing the yield, and as a result contributes to a marked reduction of the manufacturing cost of hybrid circuits which had been undesirably high.

Semiconductor materials which may be used in the present invention include germanium, silicon, and the III–V group inter-metallic compounds such as indium antimonide and gallium arsenide.

What is claimed:

1. A method of manufacturing hybrid integrated circuits comprising the steps of:

(a) preparing a semiconductor body including at least one circuit element in the body portion thereof and provided with an insulating layer on the surface thereof, (b) forming a first layer of an anticorrosive resin in a desired pattern on the insulating layer, (c) depositing a material to be formed into thin-film circuit elements over the first layer of the anticorrosive resin and the exposed areas of the insulating layer, (d) laying a second layer of the anticorrosive resin in a reverse pattern of that of the first layer of the anticorrosive resin on the material to be formed into thin-film circuit elements, (e) immersing the resulting structure in an etchant capable of etching the thin-film circuit element material and also capable of undesired etching of the insulating layer, to etch out the exposed areas of the thin-film circuit element material.

(f) subsequently removing the first and the second layers of the anticorrosive resin, and (g) electrically connecting the thin-film circuit element to the circuit element formed in the semiconductor body so that a desired electrical circuit is formed.

2. A method of manufacturing hybrid integrated circuits comprising the steps of:

(a) preparing a semiconductor body including at least one circuit element in the body portion thereof and provided with an insulating layer on the surface thereof, (b) laying a first layer of an anticorrosive resin in a desired pattern on the insulating layer, (c) depositing an anodizable metal all over the surface of the first layer of the anticorrosive resin and the exposed areas of the insulating layer in a predetermined thickness, (d) oxidizing the surface portion of the anodizable metal to obtain a predetermined sheet resistivity of the anodizable metal, (e) laying a second layer of the anticorrosive resin in a reverse pattern of that of the first layer of the anticorrosive resin on the oxide layer of the anodizable metal, (f) immersing the resulting structure in an etchant capable of etching the metal and the oxide thereof and also capable of undesired etching of the insulating layer to completely remove the exposed areas of the metal and the oxide thereof, (g) removing the first and the second layers of the anticorrosive resin, and (h) electrically connecting the thin-film circuit element to the circuit element formed in the semiconductor body so that a desired electrical circuit is formed.

References Cited

UNITED STATES PATENTS

| | | | |
|---|---|---|---|
| 3,158,788 | 11/1964 | Last. | |
| 3,169,892 | 2/1965 | Lemelson | 29—626 |
| 3,193,418 | 7/1965 | Cooper et al. | |
| 3,287,612 | 11/1966 | Lepselter | 29—578 X |
| 3,287,612 | 11/1966 | Lopselter | 29—575 X |
| 3,310,711 | 3/1967 | Hangstefer | 29—577 |

WILLIAM I. BROOKS, *Primary Examiner.*

U.S. Cl. X.R.

29—578, 625; 156—11